(12) United States Patent
Marsh

(10) Patent No.: US 6,831,498 B2
(45) Date of Patent: Dec. 14, 2004

(54) HIGH SPEED INTEGRATED CIRCUIT CURRENT SWITCH

(76) Inventor: Douglas G Marsh, 1031 Graham St., Bethlehem, PA (US) 18015-2520

( * ) Notice: Subject to any disclaimer, the term of this patent is extended or adjusted under 35 U.S.C. 154(b) by 0 days.

(21) Appl. No.: 10/314,472

(22) Filed: Dec. 9, 2002

(65) Prior Publication Data
US 2004/0108883 A1 Jun. 10, 2004

(51) Int. Cl.[7] .................................................. H02J 1/00
(52) U.S. Cl. ........................ 327/530; 327/538; 323/312
(58) Field of Search ............................... 327/530, 538, 327/541–543; 323/312, 314, 315; 326/91, 57; 330/288

(56) References Cited

U.S. PATENT DOCUMENTS

| | | | |
|---|---|---|---|
| 4,677,323 A | 6/1987 | Marsh | 327/416 |
| 5,283,479 A | * 2/1994 | Rosseel et al. | 326/104 |
| 5,396,133 A | 3/1995 | Zhang | 327/434 |
| 5,587,667 A | * 12/1996 | Inami et al. | 326/17 |
| 5,633,611 A | 5/1997 | Kohno et al. | 327/543 |
| 5,646,520 A | 7/1997 | Frank et al. | 324/158.1 |
| 5,696,459 A | 12/1997 | Neugebauer et al. | 327/108 |
| 5,767,736 A | 6/1998 | Lakshmikumar et al. | 327/536 |
| 5,796,060 A | 8/1998 | Fuchsle et al. | 218/79 |
| 5,939,947 A | * 8/1999 | Nakao et al. | 331/11 |
| 6,124,741 A | 9/2000 | Arcus | 327/157 |
| 6,160,432 A | 12/2000 | Rhee et al. | 327/157 |
| 6,246,533 B1 | * 6/2001 | Davis et al. | 360/68 |
| 6,255,872 B1 | 7/2001 | Harada et al. | 327/157 |
| 6,466,069 B1 | 10/2002 | Rozenblit et al. | 327/157 |

* cited by examiner

Primary Examiner—Timothy P. Callahan
Assistant Examiner—An T. Luu

(57) ABSTRACT

A means of high speed switching of a current source is accomplished by switching the source of the output current source transistor while employing circuitry to limit the movement of the source. The primary capacitance is the source diode, and the charge for this comes from a power rail. This results in both a reduction of and a good match of transients coupling to the output. Circuitry is also added to compensate for any current remaining when the current source is switched off.

9 Claims, 4 Drawing Sheets

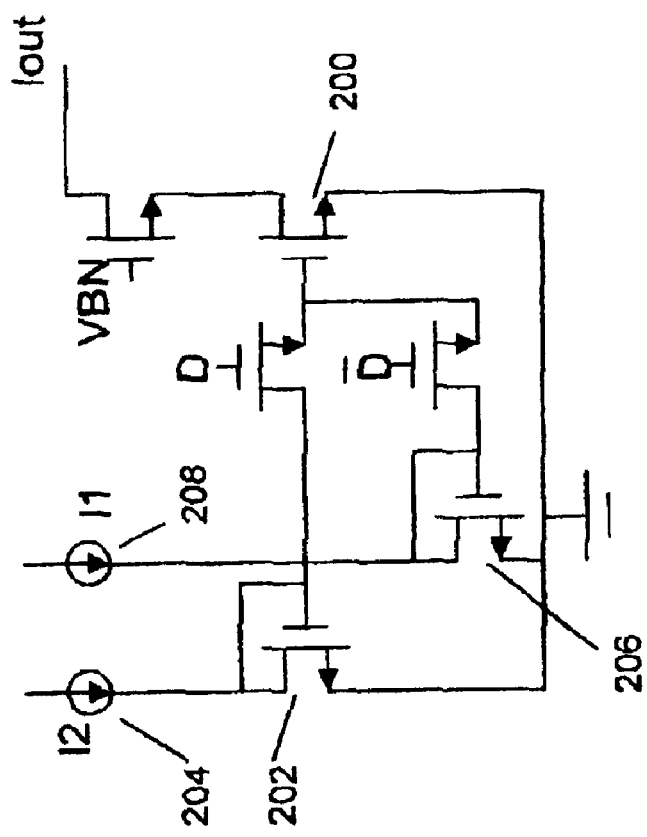
Fig 2 – Prior Art
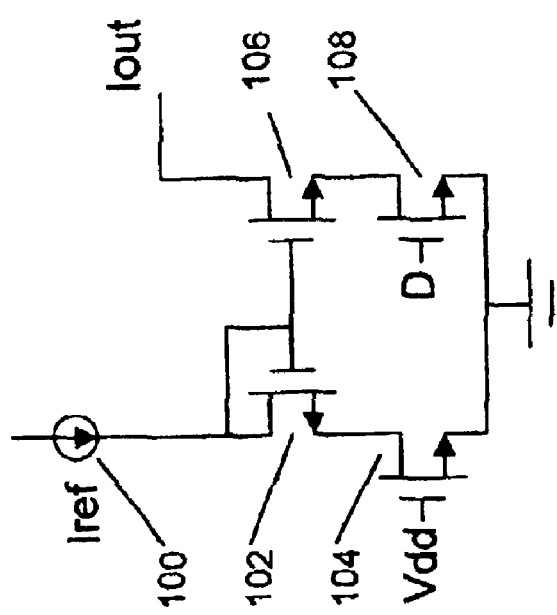
Fig 1 – Prior Art

HIGH SPEED INTEGRATED CIRCUIT CURRENT SWITCH

CROSS-REFERENCE TO RELATED APPLICATIONS

Not applicable.

BACKGROUND

1. Field of Invention

This invention relates to high speed switching, specifically, of currents in an integrated circuit.

2. Description of Prior Art

High speed switching of a current in an integrated circuit is very important in numerous applications. For example, digital-to-analog converters are often designed using currents which are switched in or out, and the speed of settling is an important metric in performance of these so-called IDACs. In Phase Locked Loops, high speed current switching is often used as part of the timing circuits. In U.S. Pat. No. 4,677,323, FIG. 1, a current reference 100 and a pair of reference transistors 102,104 connect to a current mirror transistor 106. A FET switch 108 is placed between the source of an FET current mirror transistor 106 and the power supply line. When the switch is toggled on and off, the current source is turned on and off. The current source transistor 106 acts like a cascode structure isolating the transitions at the gate of the switch from the load to which the current is being sent. This isolation reduces the transient error seen by the load and makes settling time faster than previous approaches. One concern with this patent is that if the switch is off for any long period of time, the drain of the switch transistor is free to float. This could require a relatively long time to turn the switch on, and a relatively large drain transient, both of which degrade performance.

In U.S. Pat. No. 5,767,736, the gate of the current source 200 is switched between the gates one of two current reference transistors 202,206. One of the references is the current source 204 the circuit intends to generate at his output when the current source is on. The other 208 is much lower current, typically on the order of a few percent of the first reference 204. The effect is that the gate is only switched through a relatively small voltage instead of the more conventional approach wherein the gate is switched from the current reference to the power rail. All gate transitions are small and well controlled, which is desired. However, the gate capacitance is charged through the on resistance of the switch, and if the switch is large for low on resistance, the transient voltage at the gate of the switch is coupled across its gate to drain capacitance to the gate of the current source transistor, and then through the gate to drain capacitance of the current source transistor to the output. Furthermore, the off state of the switch is not off, which adds error in some applications. Yet another deficiency to this approach is that the charge needed to charge the gate capacitance comes from the reference current source. On chip filtering is needed to ensure that the switch transients do not couple into other current sources being driven from the same reference.

U.S. Pat. No. 6,160,432 is another high speed current switch. This patent adds a cascode to the output of either of the above discussed patents. While this isolates charge feed through from the switching operation to the output, it does not address the floating source concern with the first of the gate charging of the second.

SUMMARY

In accordance with the present invention, the switch for the current source is placed between the source of the current source transistor and the power rail, as in U.S. Pat. No. 4,677,323. Means are added to limit the movement of the source when the switch is turned off. Means are also added to cancel any remaining output current when the switch turns off.

OBJECTS AND ADVANTAGES

Accordingly, several objects and advantages of this invention are:

(a) very high speed current source switching is achieved;

(b) Charge for the switch operation comes from the power rail thereby providing good isolation between current sources;

(c) transient switching errors are isolated from the output by a cascode structure; and (d) error current due to finite off current is very low.

DRAWING FIGURES

FIGS. 1 and 2 show the prior art from U.S. Pat. Nos. 4,677,323 and 5,767,736.

DESCRIPTION—PREFERRED EMBODIMENT

Figure 3:
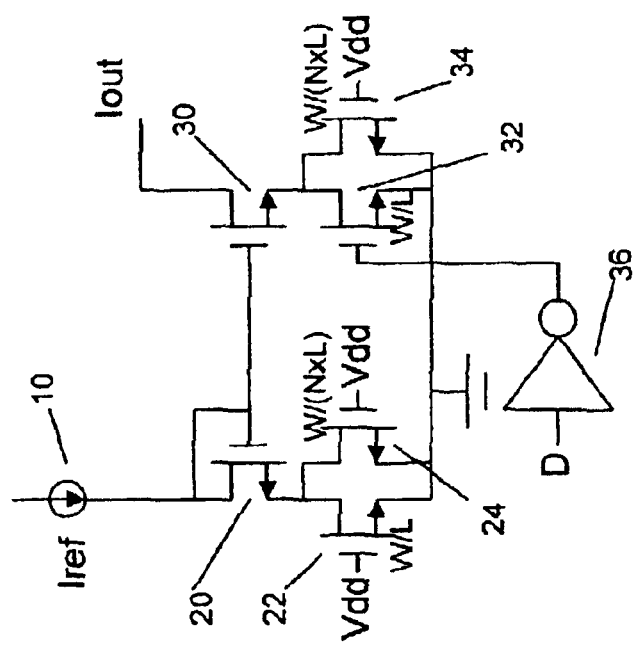
FIG. 3 shows the basic concepts of the invention wherein very high speed switching is obtained.

FIG. 3 shows the basic concept of this invention. A current source Iref 10 is applied to a gate-to-drain connected current reference FET 20. The source of the current reference transistor 20 is connected to ground through an FET 22 operating in the triode region of its I-V characteristic. A second FET 24 also operating in the triode region is tied in parallel with the first triode transistor 22. The second transistor 24 is designed to have a much lower conductance than the first transistor 22. In FIG. 3, this difference is obtained by using the same width in both devices and using a much longer gate length in the second transistor 24. Those skilled in the art will recognize that the scaling could be obtained by having a wider gate in the first transistor 22 or a combination of these two methods.

Current mirror operation is obtained by a plurality of transistors 30,32,34 with the gate of one of the transistors 30 connected to the gate of the reference transistor 20. The high conductance transistor 32 in this plurality is connected to a logic function, shown here as in inverter 36. When the output of the inverter 36 is high, the full current Iref 10 is mirrored to the drain of the mirror transistor 30. When the output of the inverter 36 is low, the drain current of the current mirror 30 will be reduced to a low level, which is hereafter referred to as Ilow. The value of this low current is often not critical, and in some applications, such as driving a laser, this current may be desired as a pre-bias of the laser.

High speed switching is achieved by limiting the voltage swing on the source of the current mirror transistor 30. No other nodes, with the possible exception of the output node depending on the design of the output loading, change voltage. The total capacitance on the source of current mirror transistor 30 is the sum of the capacitance from the three transistors 30,32,34. This capacitance can be kept low by merging junctions and applying other good layout practices. The inversion channel charge in transistor 30 is only changed by the incremental charge required to change the channel charge gradient between the high and low current levels. This will always be less than the total inversion channel charge at the high current level, and less change in charge for the same output current change results in faster speed.

Those skilled in the art will immediately recognize that the current mirror transistors 30,32,34 do not need to be matched to the reference transistors 20,22,24. For best performance, however, the current mirror transistors 30,32, 34 should be ratio matched by well known means to the current reference transistors 20,22,24.

Those skilled in the art will realize that a plurality of additional mirrors may be connected to the reference current source in the same way. Both the high and low currents outputs of these pluralities will match to the high and low currents from the current mirror transistor 30.

Figure 4:
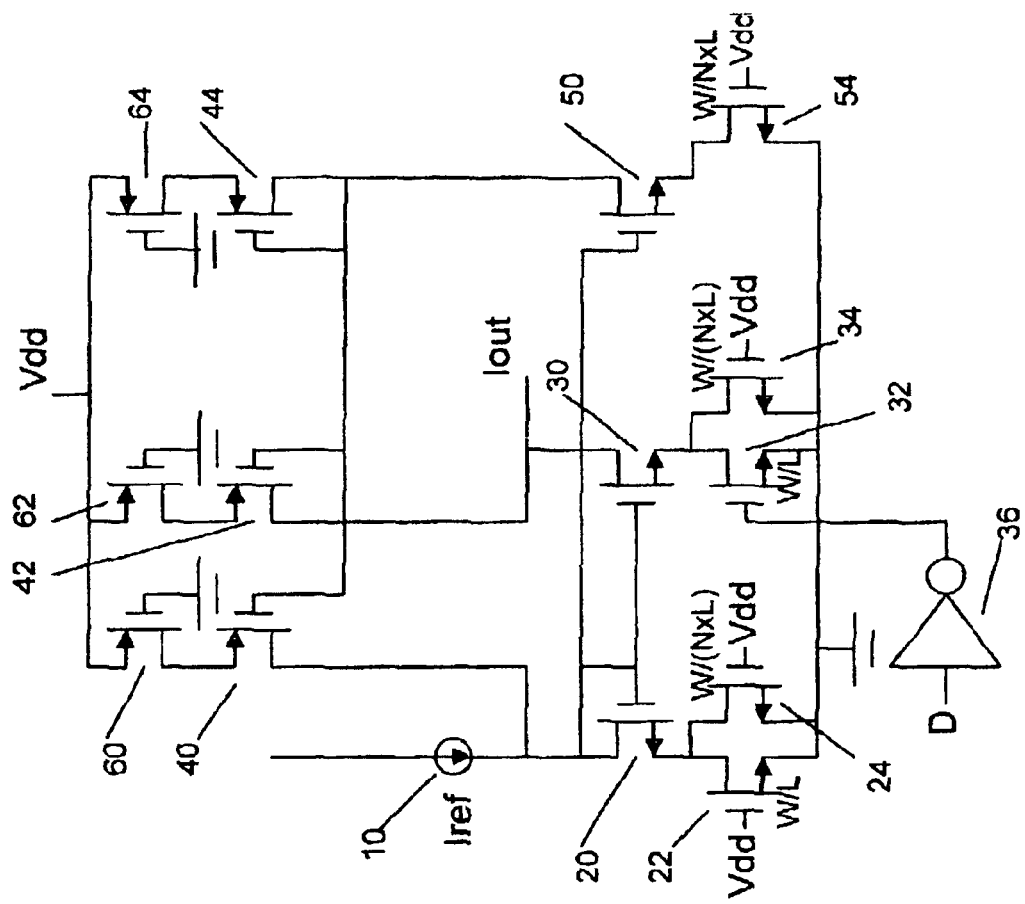
FIG. 4 shows additional currents added to the basic high speed concept so that errors are reduced.

In FIG. 4, an additional current is fed into the drain of the reference transistor 20 from a current source transistor 40, and an additional current from a current source transistor 42 is fed into the drain of the mirror transistor 30. As will become apparent, these currents modify the output current.

Figure 5:
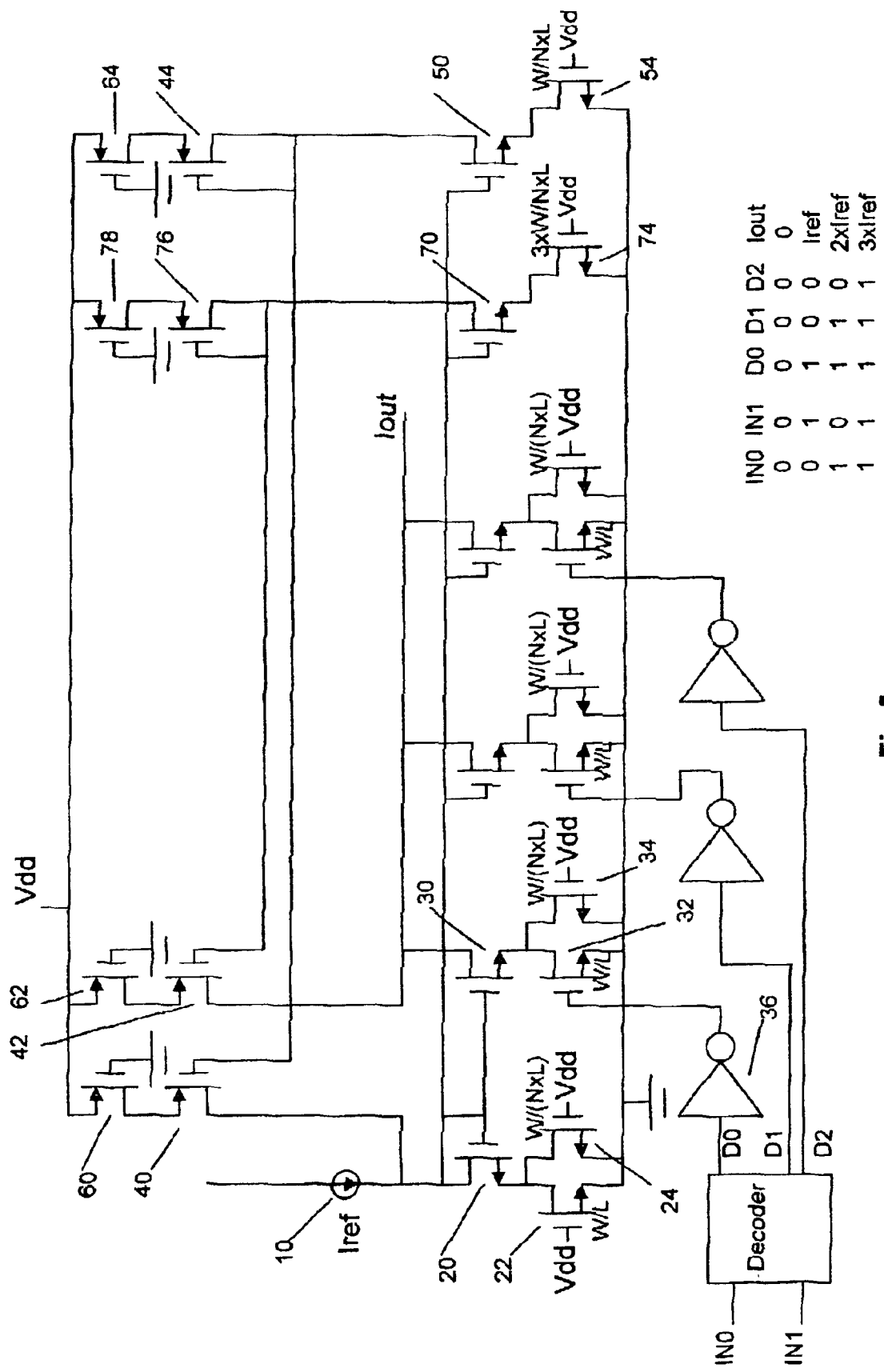
FIG. 5 shows the invention applied to an IDAC.

The gate of an additional transistor 50 is connected to the gate of current reference transistor 20. The source of this additional transistor 50 is connected to another transistor 54 operating in the triode mode. This additional triode mode transistor 54 is matched to the low conductance transistor 34 in the reference transistor plurality 30,32,34. Those skilled in the art will immediately recognize that the current in the drain of transistor 50 will be Ilow. Ilow is mirrored by a transistor 44 to other transistors 40,42. Additional transistors 60,62,64 are shown in FIG. 5. They are added to improve the matching of the currents in the drains of the flow current sources 40,42,44. Other well known means of matching can be used. Depending on the required precision of the actual implementation, it may be acceptable to eliminate this additional transistor 60,62,64.

Now it is apparent that the current in the current reference transistor 20 is Iref+Ilow. When the output of the inverter 36 is high, the current in the drain of the mirror transistor 30 will also be Iref+Ilow. Since the current from the transistor 42 is also Ilow, the output current is Iout=Iref. When the output of the inverter 36 is low, the current in mirror transistor 30 is Ilow, so the output current is Iout=0. The Ilow currents are not essential to very fast switching. In fact, they add capacitance to the output nodes, so they will slow the circuit. They are added only so Iout will be essentially zero when the current is in its off state. In many applications, such as driving a laser, it may be preferred to keep some current flowing in the off state as a pre-bias.

In applications having a multiplicity of outputs all driving the same output node, such as the two bit digital-to-analog converter having a current output, shown in FIG. 5, additional transistors 70,74,76,78 allow a single current source transistor 42,62 to minimize the added load capacitance. For good matching, transistor 70 is made by replicating transistor 30 three times.

Figure 6:
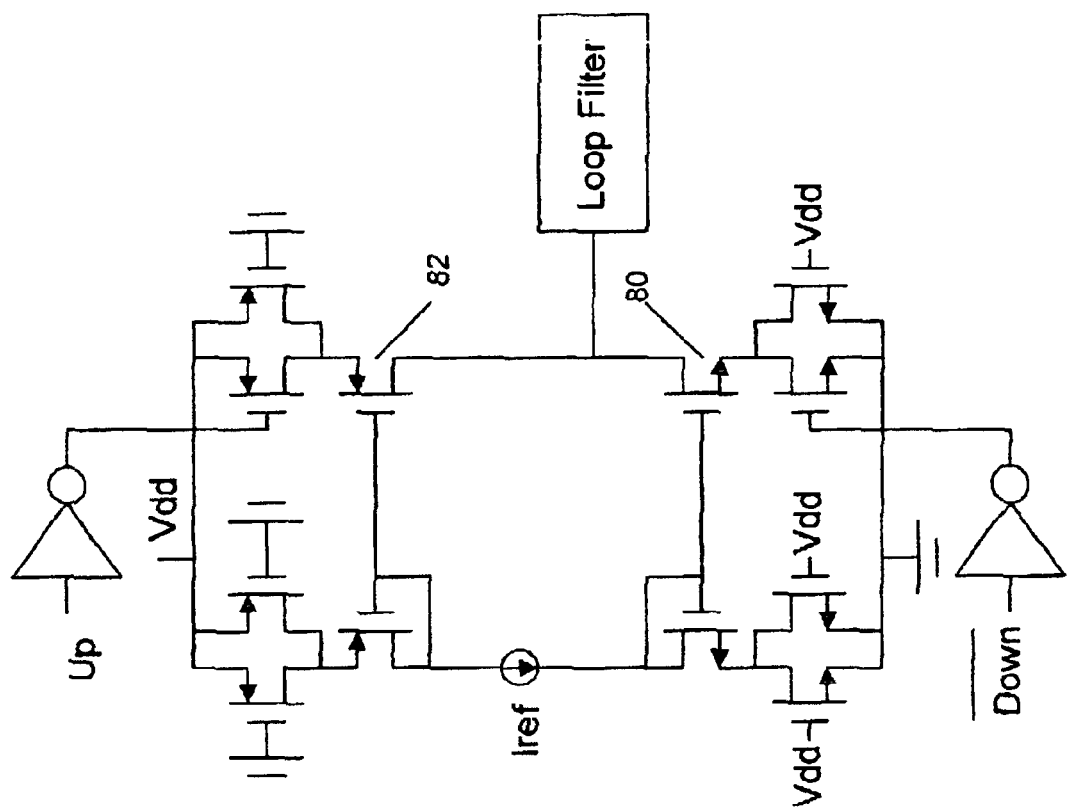
FIG. 6 shows the invention applied to a charge pump.

In FIG. 6, this invention is shown applied to a charge pump. The cascode transistors shown in FIG. 3 of U.S. Pat. No. 5,767,736 are not used here because transistors 80,82 are essentially operating as cascode structures.

It will be apparent to those skilled in the art that U.S. Pat. No. 6,160,432 can be applied to this invention, but it is not essential.

It will be apparent to those skilled in the art that other means of designing well matched current sources may be used, such as those disclosed in U.S. Pat. Nos. 4,550,284 and 4,583,037. The critical aspect of this invention is that the source of the current mirror transistor is driven by one fixed low conductance path and one high conductance path. The high conductance path is controlled by logic. For best matching, additional currents, matched to that flowing through the low conductance path, may be added to the drains of both the reference current transistor 20 and mirror current transistor 30.

Throughout the forgoing discussion, all transistors are described using MOSFET terminology. The invention applies equally well to bipolar transistors with drains replaced by collectors, gates replaced by bases, and sources replaced by emitters.

ADVANTAGES

From the description above, a number of advantages of this method of designing current source switches become evident:

(e) very high speed current source switching is achieved;

(f) transient switching errors are isolated from the output by a cascode structure; and (g) error current due to finite off current is very low.

CONCLUSIONS, RAMIFICATIONS, AND SCOPE

Accordingly, it is evident that this invention offers a high speed current source switch with error currents limited only by the matching limitations of the technology.

I claim:

1. An electronic circuit having very fast switching of an output current between a high level of current and a low level of current comprised of:

a reference current source;

a reference potential voltage;

first and second gate potential voltages;

a logic signal source switching between two output voltages whereby said output current is switched between said high level and said low level;

a first plurality of transistors all of the same polarity, a first transistor having its gate and drain connected to said current source and having its source connected to the drains of a second and a third transistor, said second transistor having its drain connected to the source of said first transistor, its gate connected to said first gate potential voltage sufficient to having said second transistor operate in its triode region and its source connected to said reference potential; and said third transistor having its drain connected to the source of said first transistor, its gate connected to said second gate potential voltage sufficient to having said third transistor operate in its triode region, its source connected to said reference potential, and said third transistor having a resistance substantially higher than said second transistor;

a second plurality of transistors all of the same polarity as the polarity of said first plurality, a first transistor having its gate connected to said current source, having its drain supplying said output current, and having its source connected to the drains of a second and a third transistor, said second transistor having its drain connected to the source of said first transistor, its gate connected to a said logic signal source, and its source connected to said reference potential; and said third transistor having its drain connected to the source of said first transistor, its gate connected to said second gate potential voltage, its source connected to said reference potential, and having a resistance substantially higher than said second transistor;

said logic signal source that switches between two states having an output voltage sufficient in one state to switch said second transistor off whereby said output current is at said low level set by said third transistor, and in the other state having the same value as said first gate potential whereby said output current is at said high level.

2. An electronic circuit as described in claim 1 having all transistors in said first plurality sealed by the same amount to form the second plurality of transistors.

3. An electronic circuit as described in claim 1 having a third plurality of transistors, a first and second transistor having the same polarity as the transistors in said first plurality of transistors, said first transistor having its gate connected to said reference current source, its source connected to the drain of a second transistor, and its drain connected to the gate and drain of a third transistor of the opposite polarity type, said second transistor having its drain connected to the source of said first transistor, its gate connected to the same said second gate potential as the gate of the third transistor in the first plurality of transistors, and having its source connected to said reference potential; said third, a fourth, and a fifth transistor of polarity opposite to said first and second transistors, said third transistor having its gate and drain connected to the drain of said first transistor, said fourth transistor having its gate connected to the drain of said first transistor and having its drain connected to the gate and drain of said first transistor in said first plurality of transistors, said fifth transistor having its gate connected to the drain of said first transistor and its drain connected to the drain of said first transistor in the second plurality, all transistors in this third plurality sealed whereby when the signal source in the second plurality is such that the second transistor is off, the resultant output current from the combined second and third pluralities will be zero.

4. An electronic circuit as described in claim 1 having additional output currents from pluralities of transistors ratio matched to those of the second plurality and interconnected in the same way as the second plurality.

5. An electronic circuit as described in claim 3 having additional output currents from pluralities of transistors ratio matched to those of the second plurality and interconnected in the same way as the second plurality.

6. An electronic circuit as described in claim 4 having any combination of the output currents connected together into one or more outputs.

7. An electronic circuit as described in claim 5 having any combination of the output currents connected together into one or more outputs.

8. An electronic circuit as described in claim 1 whereby N-channel MOSFETs may be replaced by NPN bipolar transistors and P-channel MOSFETs may be replaced by PNP transistors wherein drain connections become collector connections, gate connections become base connections, and source connections become emitter connections.

9. An electronic circuit as described in claim 3 whereby N-channel MOSFETs may be replaced by NPN bipolar transistors and P-channel MOSFETs may be replaced by PNP transistors wherein drain connections become collector connections, gate connections become base connections, and source connections become emitter connections.

* * * * *